United States Patent
Pelletier et al.

(10) Patent No.: US 6,755,069 B1
(45) Date of Patent: Jun. 29, 2004

(54) METHOD AND TOOLING FOR Z-AXIS OFFSET OF LEAD FRAMES

(75) Inventors: William J. Pelletier, Conventry, RI (US); Wayne E. Mann, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/671,083

(22) Filed: Sep. 27, 2000

Related U.S. Application Data

(60) Provisional application No. 60/157,780, filed on Oct. 5, 1999.

(51) Int. Cl.[7] .............................................. B21D 22/02
(52) U.S. Cl. .............................. 72/414; 29/874; 29/882
(58) Field of Search .................... 72/412, 414; 29/874, 29/882; 140/123

(56) References Cited

U.S. PATENT DOCUMENTS

| | | | | |
|---|---|---|---|---|
| 4,283,839 A | * | 8/1981 | Gursky ....................... 438/123 |
| 5,053,852 A | * | 10/1991 | Biswas et al. ............... 257/669 |
| 5,126,820 A | * | 6/1992 | Brown ........................ 257/420 |
| 5,391,439 A | * | 2/1995 | Tomita et al. ............... 428/571 |
| 5,819,579 A | * | 10/1998 | Roberts ........................ 72/414 |
| 6,075,286 A | * | 6/2000 | Ewer ........................... 257/666 |
| 6,171,888 B1 | * | 1/2001 | Lynch et al. ................. 438/106 |
| 6,357,275 B1 | * | 3/2002 | Ellis et al. ..................... 72/414 |
| 6,401,765 B1 | * | 6/2002 | Carter et al. ................. 140/105 |

* cited by examiner

*Primary Examiner*—Daniel C. Crane
(74) *Attorney, Agent, or Firm*—Wade James Brady, III; Frederick J. Telecky, Jr.

(57) ABSTRACT

A method and apparatus for enabling z-axis offset of narrow metal ties straps in lead frames used for packaging integrated circuits to prevent bowing or distortion. Simultaneous offsetting of the tie strap and stress relief mechanisms are provided on both the front and back sides of the lead frame. Those mechanisms include indentations along the long or primary axis of each tie strap, coupled with depressions across the top surface both at the center of the lead frame and between the base of the off set and the chip attach locations to prevent bowing in small pad and no pad lead frames, in particular.

20 Claims, 4 Drawing Sheets

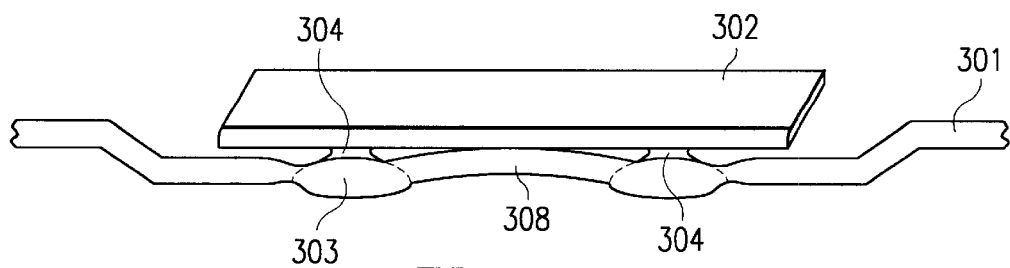
FIG. 3a
(PRIOR ART)
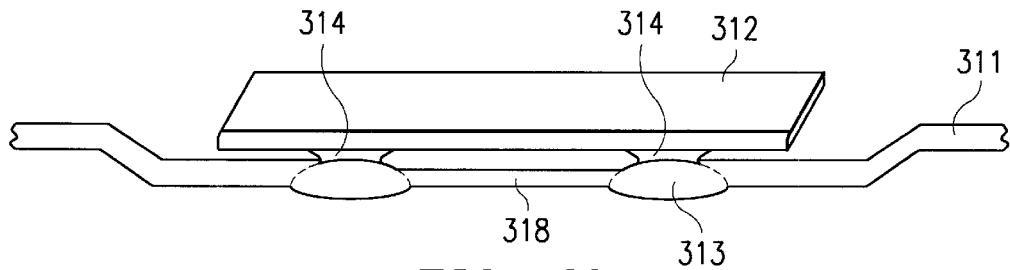
FIG. 3b
FIG. 4a
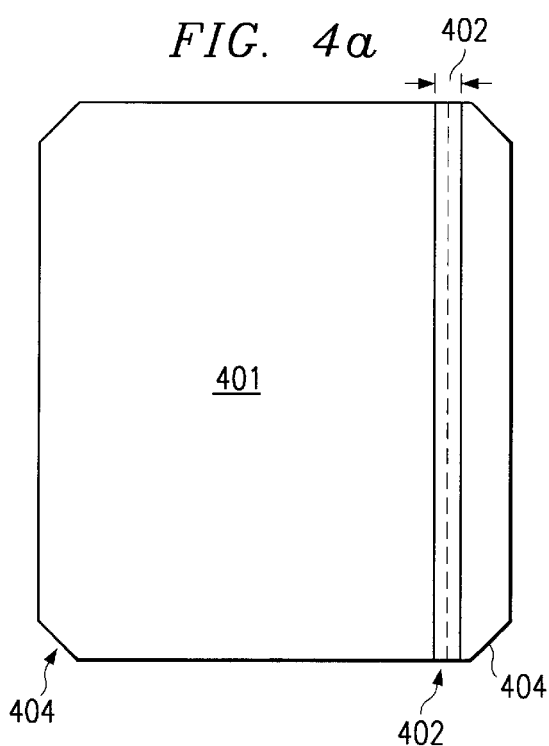
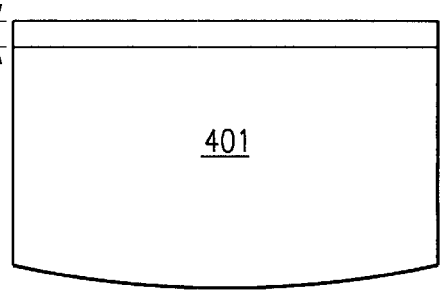
FIG. 4a'

US 6,755,069 B1

METHOD AND TOOLING FOR Z-AXIS OFFSET OF LEAD FRAMES

This application claims the benefit of Provisional application No. 60/157,780 filed Oct. 5, 1999.

FIELD OF THE INVENTION

This invention relates generally to the field of metal forming, and more particularly to the forming of lead frames used in the assembly of micro electronic devices.

BRIEF DESCRIPTION OF PRIOR ART

Integrated circuit devices, having an integrated circuit chip and a lead frame which are sealed within a protective enclosure find wide use in products, among which are consumer electronics, computers, automobiles, telecommunications and military applications. A means to electrically interconnect an integrated circuit chip to circuitry external to the device frequently takes the form of a lead frame. The lead frame is formed from a highly electrically and thermally conductive material, such as copper or copper alloys. The lead frame is stamped or etched into a plurality of leads, and a central area, called a chip pad, on which the integrated circuit chip is attached. The chip is electrically connected to the leads, usually by wire bonding, and the device is encapsulated to provide mechanical and environmental protection.

Lead frames typically include a solid chip pad somewhat larger than the chip to which the integrated circuit chip is attached by an adhesive or alloy. However, currently many lead frames 101 are fabricated with a single or multiple small circular pads 102 as shown in FIG. 1, or simply to strips of metal where the chip is attached, and the large chip pad is eliminated. The chip pads 102 are connected to outer support rails 105 by thin etched or stamped extensions of the metal, called tie straps 106. Support rails 105 also hold together one or more lead frames in a strip until encapsulation is completed.

Those lead frames having one or more small pads 102 as in FIG. 1 are typically referred to as S-pad or small pad lead frames. A small, circular pad is positioned approximately mid-way from the edge of the tie strap to the center of the lead frame where the tie straps intersect 108. The chip is positioned atop the frame and the unpatterned side of the chip attached to the pads by an adhesive. An outline of a chip position is represented by the dashed line 103.

As shown in FIG. 2a, lead frames 201 may be attached to the active patterned surface of the chip 203, as in devices referred to as LOC or lead-on-chip, and illustrated in FIGS. 2a and 2b. A chip is attached to a flat portion of the lead frames itself, and most often to a down-set or offset portion 209 of the frame.

Lead frames having a reduced chip pad area were developed in response to a failure mechanism in surface mount packages often referred to as "pop corning". Moisture ingress into the plastic package is trapped between the chip and the metal chip pad, and when subjected to a rapid thermal excursion, such as solder attachment to a printed wiring board, the vapor pressure causes the plastic package to bulge and sometimes crack. This failure mechanism can be avoided by eliminating the large solid metal die pad.

In the process of lead frame down-setting a selected strip of metal is elongating in a die under pressure from either a hydraulic or electrically driven press while the support metal remains planar. The metal in two or more tie straps metal is forced downward to form angled bends and is pressed toward the center of the lead frame by using a forming punch to press the tie straps against the die surface. The more ductile metal, following the path of least resistance moves toward the center where the tie straps converge, and lacking a relief mechanism, the metal strip bows. FIG. 3a is a schematic of a lead frame 301 with bowed tie strap 308 at the center where the tie straps converge. The semiconductor chip 302 is attached to the small pads 303 by adhesive 304 only at localized area owing to the non-planar attach area. The schematic in FIG. 3a demonstrates a device bowed in a concave direction. Convex bowing is equally as big an issue for the assembly of semiconductor devices.

In conventional lead frames having a rigid or solid chip attach pad in the center, stress is relieved in the large pad, and bowing is much less of a problem. However, in the case of small pad frames where only small relief areas are provided, the narrow metal frequently is distorted at the location where pressure converges.

However, small or no pad lead frames are not without significant manufacturing challenges. One of the more difficult issues has been warping or distortion of the long thin tie straps which occurs during offsetting the chip mount area. Either convex or concave bowing of the tie strap and chip attach areas prevent the chip from seating correctly.

Owing to the reduced contact area for chip attachment, it is imperative that the chip attach area be planar and allow the small amount of adhesive on the pads to contact and firmly seat the chip. Losses resulting from bowed or distorted lead frames result in not only yield loss, but also present a reliability concern for both mechanical stresses on wire bonds, as well as diminished thermal transport path. A solution to this issue has been sought by the industry since the inception of small pad and no pad packaged devices.

SUMMARY OF THE INVENTION

As thinner integrated circuit packages, and consequently thinner lead frames are demanded by the industry, warping and distortion of the lead frame chip attach area has becomes a more prevalent issue. Further, the heavily favored lead frame materials are alloys of copper because of its excellent thermal conductivity and ease of processing, but the malleability and ductility of these copper alloys allows greater warping than other more rigid metallic alloys.

It is an object of this invention to provide an essentially no cost, permanent, and consistent means of eliminating bowing and distortion of lead frame tie straps resulting from the z-axis down-setting process.

It is an object of the invention to provide tooling which is common to a large family of devices, and the methodology for altering the tooling design to be applicable to many other lead frames sizes and shapes.

The chip attach area of lead frames is offset from the plane of the lead frame in order to minimize the length and looping height of bonding wires by positioning the chip surface at more nearly the same level as the lead frame bond fingers to which bond wires are attached. Offset or z-axis down-set is accomplished by positioning the stamped or etched lead frame in a press having a down-set die and a forming tool. The material to be offset is elongated by the contact and pressure from the forming tool, thereby stretching the metal and increasing its length with respect to the surrounding planar portion of the lead frame. The metal is being elongated or stretched along the surface of the forming die from opposite sides of the lead frame and converges toward the center of the lead frame. This results in the central area bowing in either a concave or convex direction, either of which is unacceptable.

The present invention provides a set of inserts to be positioned in the down-set die which have a protrusion above the die surface in the center of each tie strap. In addition, a series of protrusions are fabricated on the down-set forming punch. The insert tooling forms an indentation on the backside of the tie strap which allows the lead frame material to be pushed upward, and to move to the outer edge of the tie strap. In the same operation, protrusions on the forming punch create small lateral impressions on the top surface of the tie strap which control the flow of material being pushed toward the center of the lead frame during down-setting. Simultaneously creating small controlled indentations in the top and bottom surfaces, as well as along both the longitudinal and horizontal axis allows relief for the deformed lead frame material, and results in a flat, planar chip attach area.

BRIEF DESCRIPTION OF THE DRAWINGS

FIG. 3a is a cross sectional view of a prior art down-set "S" pad lead frame.

FIG. 3b is a cross sectional view of a down-set "S" pad lead frame fabricated using the method of the current invention.

FIG. 4a is a planar schematic view of a die insert of the current invention.

FIG. 4a' is a cross sectional view of a die insert of the current invention.

DETAILED DESCRIPTION OF THE PREFERRED EMBODIMENTS

In accordance with the present invention, there is provided a method to eliminate bowing or distortion of lead frames resulting from offsetting the tie straps, including the first step of providing the necessary forming tools Detailed descriptions of the preferred embodiment are provided herein. It is to be understood, however, that the present invention may be embodied in various forms. Therefore, specific details disclosed herein are not to be interpreted as limiting, but rather as a basis for teaching one skilled in the art to employ the present invention in virtually any appropriate detailed system, structure or manner.

A preferred embodiment of the present invention uses conventional hydraulic or electrically driven presses for offsetting lead frames, in combination with a novel offset tooling set. The improved tooling set of the current invention simultaneously relieves stress on the bottom surface and the top surface of the lead frame tie strap during the down-setting process and avoids build-up and bowing of the metal toward the center of the work-piece. FIG. 3b illustrates the chip 312 attached to small chip pads 313 in a lead frame 311 processed using the forming tooling of the current invention, wherein the tie strap, the small pads 313 and the central area 318 where tie straps converge is flat after offset forming.

Figure 1:
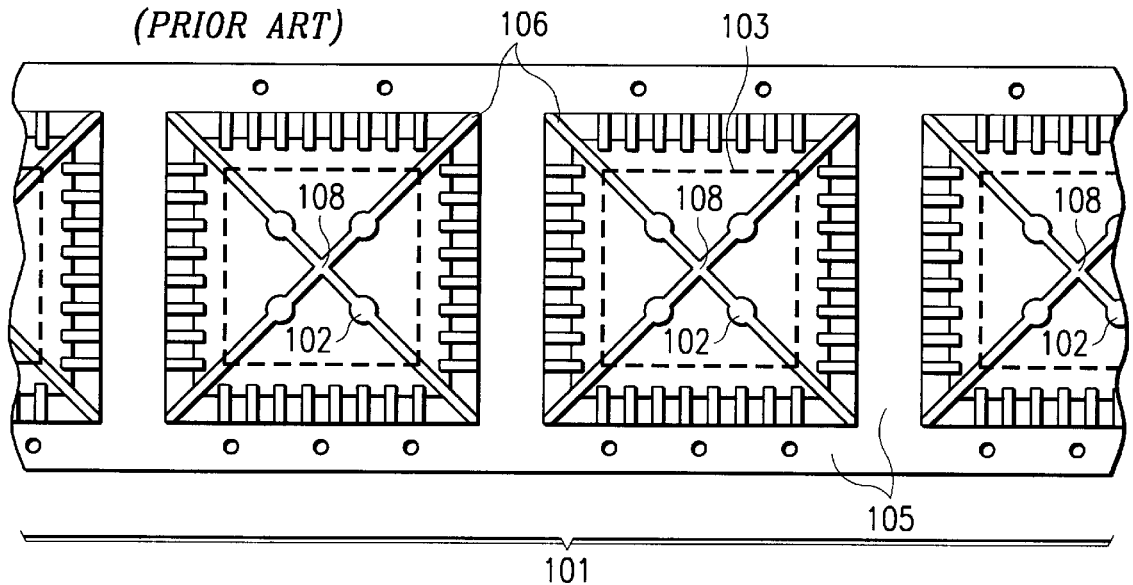
FIG. 1 is a plane view of a prior art "S" or small pad lead frame.
Figure 2A:
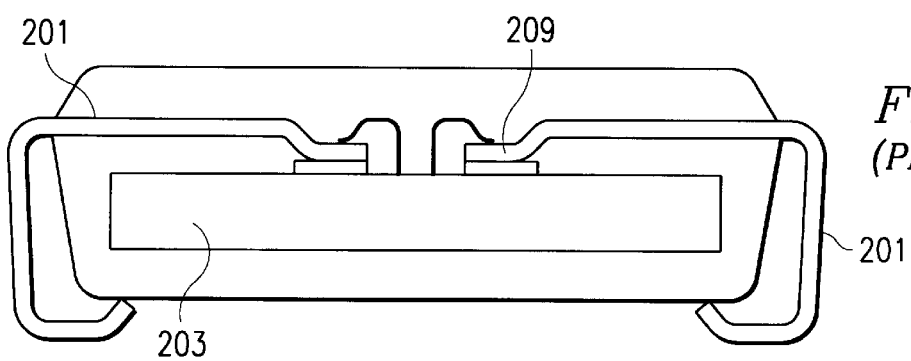
FIG. 2a is a cross section of a known LOC package.
Figure 2B:
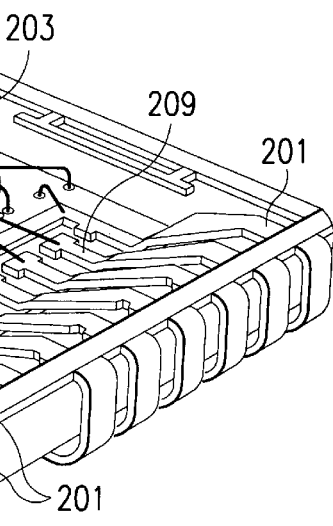
FIG. 2b is a plane view of a known LOC type lead frame.
Figure 4B:
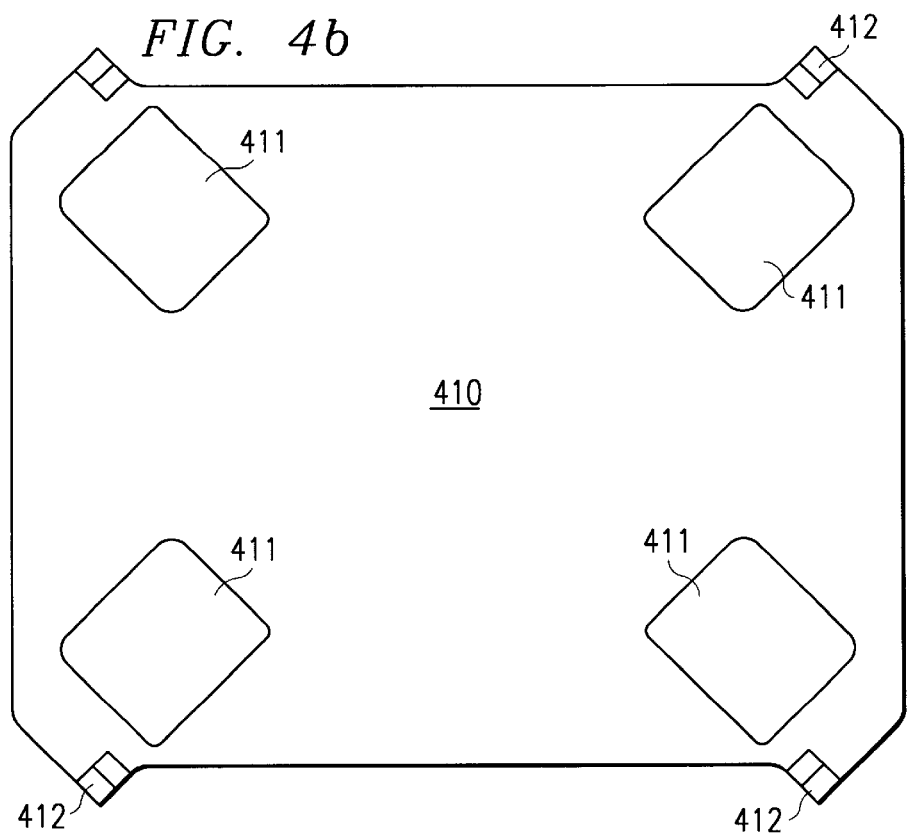
FIG. 4b is a schematic view of the die surface with insert locations.

FIG. 4a and 4a' are planar and cross sectional schematic representations of one of a set of tools to be insert into the surface of the down-set die. Each insert tool 401 comprises a steel device having a rib 402 which protrudes about 0.0005 inches above the surface of the die, and corners 404 shaped to conform to those of a cavity in the die. FIG. 4b shows the locations of cavities 411 in the die surface 410. One rib shaped tool 401 is provided to be positioned in each cavity 411 between the angled down-set areas 412, and the small pad of the lead frame (not shown). The preferred embodiment provides a cavity 411 in the die for each pad of a four (4) small circular pad device.

Length and width of the protrusions 402 on the insert tools 401 are determined by the specific lead frame dimensions. The length is derived from the location of chip pads and the base of the downs set, and will extend inside those boundaries. In the preferred embodiment the tool is in about 0.12 inches long. Width of the protruding rib is dependent upon the width of lead frame tie strap, and the width 403 of the protrusion is about 0.0002 inches wide for a tie strap of nominal width 0.012 inches.

Protrusions 402 on the inserts force the ductile lead frame metal to create an indentation on the bottom side along the primary axis of the tie strap, and to flow toward the outer edge of the lead frame metal, rather than simply moving toward the center of the device.

Figure 5:
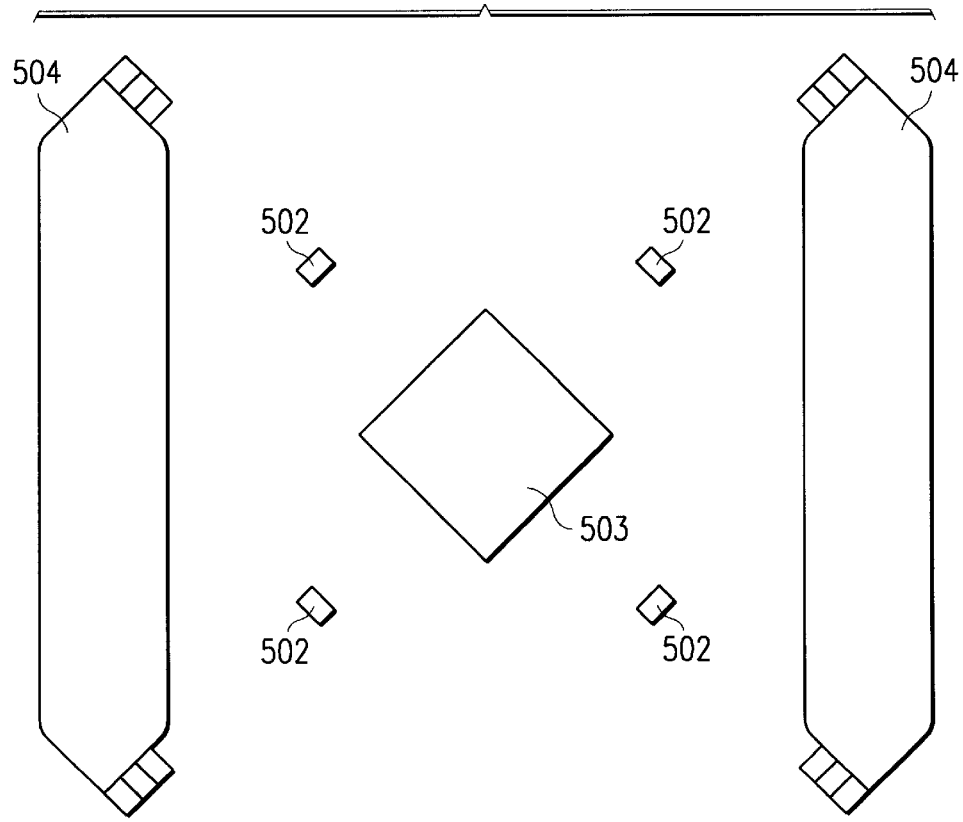
FIG. 5 provides a schematic of a forming punch tool with protrusions and locations.

The surface of the forming punch, as shown in FIG. 5 has a series of down set angles 504 which press the lead frame tie straps onto the die surface, thereby forming a down-set area out of plane with the support straps. The downs-set angle is 30 degrees and depth of the down-set in the preferred embodiment is about 0.009 inches. The forming punch of the current invention includes five (5) protrusions 502/503 of about 0.0005 inches height on the surface of the tool. There are 4 small protrusions 502, each of which contacts one of the tie straps, and a centrally located large protrusion 503 which contacts all of the tie straps. These protrusions correspond to the locations where impressions are formed on the top surface of the tie strap. An array of four (4) protrusions 502, about 0.015 to 0.016 inches on a side create a horizontal depression, about 0.015 inches long in the tie strap near the edge of each small circular chip pad, on the side toward the angled down-set. These impressions extend the full width of the tie strap, and are perpendicular to the backside indentations. The fifth protrusion 503 on the forming tool is a square positioned at the center of the tool so that one side intersects each of the tie straps, and makes a depression from a location near the edge of the circular chip pad across the center of the lead frame to near the pad on the opposite tie strap. Protrusions on the forming punch are about 0.0003 inches in height, and spacing is related to the location and size of the circular die pads. In the preferred embodiment, the square protrusion is about 0.13 inches, and will form an impression extending radially about 0.065 inches inward from the center of the tie strap intersection.

The impressions on the top surface of the lead frame horizontal to the length of the tie strap, coupled with the longitudinal indentation on the backside of the tie strap allow the metal to be moved laterally toward the edges on the back side, and provide a horizontal relief stop for the metal as it moves toward the center on the top side.

Figure 6:
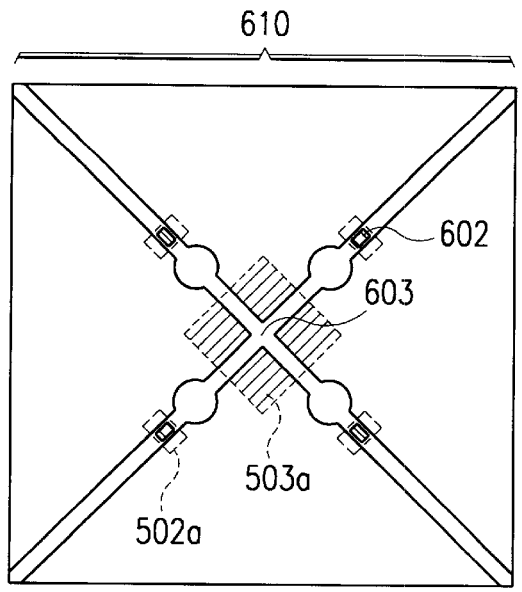
FIG. 6 is a plane view of the top surface of an "S" pad lead frame having impressions from forming punch protrusions.

FIG. 6 illustrates the top surface 610 of a small pad lead frame having depressions 602/603 as created by the forming tool protrusions 502/503 in FIG. 5. Each impression extends the width of the tie strap, and is about 0.0002 to 0.0003 inches deep. Shaded areas 602/603 represent the depressed area caused by protrusions 502/503 on the forming tool. The outline of protrusions 502/503 is represented by dashed lines 502a/503a in FIG. 6.

Figure 7:
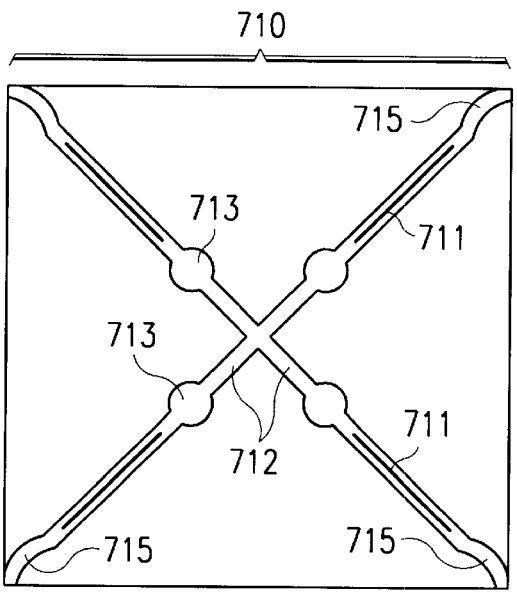
FIG. 7 is a plane view of the bottom surface of an "S" pad lead frame having indentations from the die inserts.

FIG. 7 is a plane view of the back surface of the lead frame 710. Indentations 711 along the primary axis of the tie strap 712 result from pressing the tie straps against ribs 402 on the form die insert as shown in FIG. 4a. Indentations 711 are in the range of 0.00035 to 0.0005 inches in depth, and are located between the termination of the down-set angle termination 715 and the circular chip pad 713. Indentations are designed to terminate prior to the onset of impressions 602 on the top surface in FIG. 6.

Figure 8:
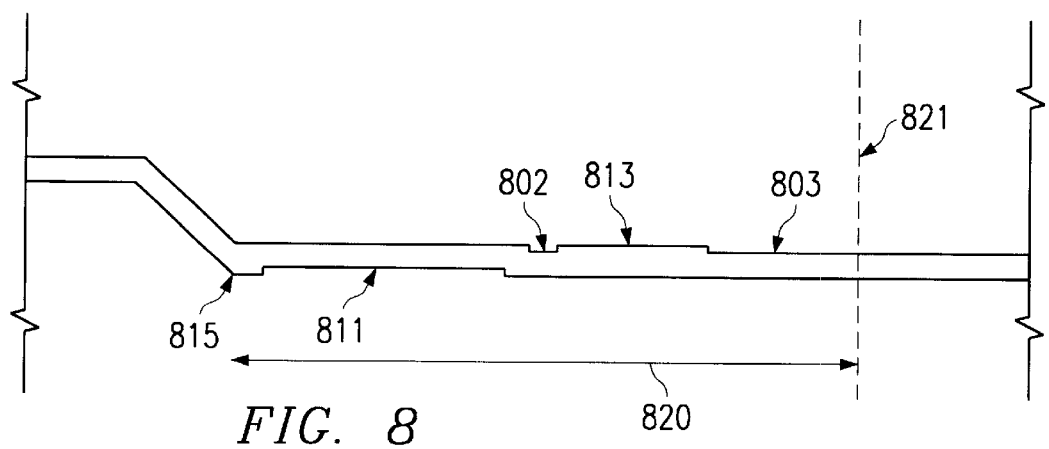
FIG. 8 shows the relative positions of stress relief mechanisms on an "S" pad lead frame

FIG. 8 illustrates the relative locations of the top surface depressions 802/803 and the bottom surface indentations 811 with respect to the termination of the down-set angle 815 and the circular chip pad 813 in one half of a lead frame 820 cross section. The center of the lead frame where tie straps converge is noted by the dashed lines 821.

It should be understood that within a standardized lead pitch and for a specified number of leads on a lead frame, the small pad lead frame accommodates a large range of chip sizes. For example, a 132 pin quad flat pack lead frame may be used for many chip sizes and types, and therefore, the embodiment of this invention is applicable to a large number of Integrated circuit devices.

It should further be understood that precise dimensions of the indentations and impressions are dependent upon the lead frame dimensions, and that tooling dimensions are different for different lead frames, but the relative locations are similar, and therefore the invention is applicable to the entire family of small pad lead frames.

It should further be understood that the preferred embodiment described a tooling set and application including four (4) small circular chip pads, but that the invention is applicable to devices having a single circular or other shaped chip pads by omitting the center protrusion on the forming press. It is further applicable to LOC (lead-on-chip) or COL (chip-on-lead) lead frames where there are no chip pads, or to conventional pad devices where distortion of the ties strap is a problem. Such devices include those having a deep down-set angle, long tie straps or very thin or ductile material.

It should also be understood that because the stress relief mechanisms of forming depressions in both the front and back side of the lead frame are created during the forming process, the solution is permanent, as opposed to a solution where the stress corrected, but may return as a function of memory in the metal.

Because the stress relief mechanisms are created by hard tooling with limited tolerance ranges, the relief mechanisms are reproducible and limited by tooling tolerances.

What is claimed is:

1. A method for offsetting a narrow ductile metal part wherein the offset section is stress relieved, the method comprising the steps of:
   providing a form die with protruding rib inserts along the primary axis of said metal part,
   providing a forming punch with protrusions horizontal to said die protrusion ribs,
   positioning said metal part on the surface of said form die, and
   aligning said forming punch to the die, then applying pressure to said punch to form an off-set plane with stress relief depressions in the metal by the die protrusion ribs and the protrusions.

2. A method as in claim 1 wherein said metal part is a lead frame for interconnecting a semiconductor device.

3. A method as in claim 1 wherein said inserts and said forming punch comprise steel.

4. A method as in claim 1 wherein the applied pressure is in the range of 300 to 500 pounds force.

5. A method as in claim 1 wherein said metal parts comprise copper.

6. A method as in claim 1 wherein said form die in positioned in a hydraulic press.

7. A method as in claim 1 wherein said form die is positioned in an electrically driven press.

8. A method as in claim 1 wherein stress on said metal part is relieved by longitudinal indentations on the back side and concurrently by horizontal depressions on the front side arrayed between the bottom of the down-set and the center of the metal part.

9. A method as in claim 1 which is applicable to metal parts having different shapes and sizes.

10. A method as in claim 1 wherein stress relief mechanisms of indentations are permanent.

11. A method as in claim 1 wherein said stress relief mechanisms are accurate and reproducible.

12. A method for offsetting a tie strap in a lead frame part wherein the offset section is stress relieved, the method comprising the steps of:
   providing a form die comprising steel with protruding rib inserts along the primary axis of said tie strap,
   providing a forming punch comprising steel with protrusions horizontal to said die protrusion ribs,
   positioning said lead frame part on the surface of said form die, then aligning said forming punch to the die positioned in a press, applying 300 to 500 pounds force, and simultaneously creating an off-set plane while creating permanent stress relief depressions in the tie strap comprising longitudinal indentations on the back side and horizontal depressions on the front side arrayed between the bottom of the offset and the center of the metal part.

13. A method for offsetting a tie strap in a lead frame part wherein the offset section is stress relieved, the method comprising the steps of:
   providing a form die with a protruding rib having a lenoth with a primary axis extending along the primary axis of said tie strap;
   providing a forming punch;
   positioning said lead frame part on the surface of said form die;
   aligning said forming punch to said die; and
   applying force to said punch to press the protruding rib against the tie strap.

14. The method of claim 13, wherein said step of providing a forming punch comprises providing a forming punch with protrusions horizontal to said die protrusion ribs.

15. The method of claim 13, wherein said step of providing a form die comprises providing a steel form die.

16. The method of claim 13, wherein said step of providing a forming punch comprises providing a steel forming punch.

17. The method of claim 13 wherein said step of applying force to said punch comprises applying approximately 300 to 500 pounds force to said punch.

18. The method of claim 13, wherein said lead frame part is a small pad lead frame.

19. The method of claim 18, wherein said small pad lead frame comprises a small circular pad.

20. The method of claim 13, wherein said lead frame part is a lead-on-chip lead frame.

* * * * *